(12) United States Patent
Park

(10) Patent No.: US 6,897,480 B2
(45) Date of Patent: May 24, 2005

(54) ACTIVE MATRIX ORGANIC ELECTROLUMINESCENCE DEVICE AND METHOD OF MANUFACTURING THE SAME

(75) Inventor: Jae-Yong Park, Anyang-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/327,086

(22) Filed: Dec. 24, 2002

(65) Prior Publication Data

US 2003/0127643 A1 Jul. 10, 2003

(30) Foreign Application Priority Data

Dec. 28, 2001 (KR) ................................ 10-2001-0087398

(51) Int. Cl.[7] .......................... H01L 29/04; H01L 31/20; H01L 31/036; H01L 31/0376
(52) U.S. Cl. ............................. 257/59; 257/52; 438/149; 438/155
(58) Field of Search .................... 257/52, 59; 438/149, 438/155

(56) References Cited

U.S. PATENT DOCUMENTS

| | | | |
|---|---|---|---|
| 6,278,423 B1 * | 8/2001 | Wald et al. ................... 345/76 |
| 6,611,245 B1 * | 8/2003 | Edwards ....................... 345/76 |
| 6,617,608 B2 * | 9/2003 | Bae et al. ...................... 257/40 |
| 2001/0007413 A1 * | 7/2001 | Battersby .................. 315/169.3 |
| 2003/0122747 A1 * | 7/2003 | Shannon et al. .............. 345/76 |
| 2003/0137255 A1 * | 7/2003 | Park et al. ............... 315/169.3 |

FOREIGN PATENT DOCUMENTS

| | | |
|---|---|---|
| EP | 001096466 A1 * | 5/2001 |
| KR | 2000-0068846 | 11/2000 |

* cited by examiner

*Primary Examiner*—Long Pham
(74) *Attorney, Agent, or Firm*—McKenna Long & Aldridge LLP

(57) ABSTRACT

An active matrix organic electroluminescence device includes a substrate, a gate line on the substrate, a data line crossing the gate line, a power line parallel with the gate line, a switching thin film transistor electrically connected to the gate line and the data line, wherein the switching thin film transistor includes a first gate electrode, a first active layer, and first source and drain electrodes, a driving thin film transistor electrically connected to the first drain electrode, wherein the driving thin film transistor includes a second gate electrode, a second active layer, and second source and drain electrodes, and a luminescent diode connected to the driving thin film transistor and the power line.

9 Claims, 5 Drawing Sheets

ACTIVE MATRIX ORGANIC ELECTROLUMINESCENCE DEVICE AND METHOD OF MANUFACTURING THE SAME

The present invention claims the benefit of Korean Patent Application No. 2001-87398 filed in Korea on Dec. 28, 2001, which is hereby incorporated by reference for all purposes as if fully set forth herein.

BACKGROUND OF THE INVENTION

1. Field of the Invention

The present invention relates to an active matrix organic electroluminescence device and a manufacturing method of the same.

2. Discussion of the Related Art

In general, an organic electroluminescence device emits light by injecting an electron from a cathode electrode and a hole from an anode electrode into an emissive layer, combining the electron with the hole, generating an exciton, and transiting the exciton from an excited state to a ground state. The organic electroluminescence device has a small size and light weight because it does not require additional light sources.

The organic electroluminescence device is categorized into a passive matrix type and an active matrix type according to a driving method.

The passive matrix type organic electroluminescence device has a simple structure and is manufactured through a simple process. However, the passive matrix type organic electroluminescence device has high power consumption and is difficult to make to have a large area. Additionally, in the passive matrix type organic electroluminescence device, an aperture ratio decreases according to the increasing number of electro lines.

Therefore, the passive matrix type organic electroluminescence device is widely used as a small size display device. On the other hand, the active matrix type organic electroluminescence device is widely used as a large size display device.

An active matrix type organic electroluminescence device according to the related art will be described hereinafter more in detail.

FIG. 1 is an equivalent circuit diagram for a pixel of an active matrix type organic electroluminescence device in the related art. In FIG. 1, a gate line 12 is formed horizontally in the context of the figure on a substrate 10. A power line 9 is formed parallel to the gate line 12. A data line 14 is formed vertically in the context of the figure and crosses the gate line 12 and the power line 9. The gate line 12 and the data line 14 define a pixel region. A pixel includes two thin film transistors (TFTs) "T1" and "T2," an electroluminescent diode "EL," and a storage capacitor "C." The TFTs are composed of a switching TFT "T1" and a driving TFT "T2." Each TFT includes a gate electrode, an active layer, and source and drain electrodes. The switching TFT "T1" is formed at the crossing of the gate line 12 and the data line 14. The gate electrode of the switching TFT "T1" is electrically connected to the gate line 12 and the source electrode of the switching TFT "T1" is electrically connected to the data line 14. The gate electrode of the driving TFT "T2" is electrically connected to the drain electrode of the switching TFT "T1 ," the source electrode of the driving TFT "T2" is electrically connected to the power line 9, and the drain electrode of the driving TFT "T2" is electrically connected to one end of the electroluminescent diode "EL," that is, an anode electrode. The other end of the electroluminescent diode "EL," i.e., cathode electrode, is ground. One end of the storage capacitor "C" is electrically connected to the gate electrode of the driving TFT "T2 " and the other end of the storage capacitor "C" is also grounded.

When the driving TFT "T2" turns on by a signal through the switching TFT "T1 " from the data line 14, a signal from the power line 9 is transmitted to the electroluminescent diode "EL" through the driving TFT "T2," and light is emitted from the luminescent diode "EL."

Although the switching TFT "T1" turns off, the storage capacitor "C," which is connected to the switching TFT "T1" and the driving TFT "T2," maintains the signal from the data line 14 until the next signal is transmitted. Therefore, signal loss is compensated. However, there may be signal loss due to an increasing resistance of the electroluminescent diode "EL" with the lapse of time.

To compensate the signal loss, an organic electroluminescence device having four TFTs has been proposed. However, formation of the four TFTs reduces the production rate of the devices.

Meanwhile, p-type polycrystalline silicon is widely used as an active layer of the switching TFT "T1 " and the driving TFT "T2." Polycrystalline silicon may be formed by a crystallization method using a laser, but the polycrystalline silicon has poor uniformity. Moreover, a manufacturing process of the polycrystalline silicon is complicated and requires a lot of time due to deposition of an amorphous silicon layer, irradiation of a laser beam, and crystallization of the amorphous silicon layer.

Accordingly, in manufacturing the four TFTs including polycrystalline silicon, production costs of the device are increased due to the increasing number of manufacturing processes. Besides, the uniformity of image may be reduced.

To solve the problem, an organic electroluminescence device including an amorphous silicon TFT, which has amorphous silicon as an active layer, is shown in Korean Patent Publication No. 2001-0027787. The amorphous silicon TFT is p-type in which holes are the major carrier. However, the p-type amorphous silicon TFT is difficult to manufacture and has lower field effect mobility and lower on-current than an n-type amorphous silicon TFT in which electrons are the major carrier.

FIG. 2 is a circuit diagram of an active matrix type organic electro-luminescence device having an n-type amorphous silicon TFT in the related art and corresponds to a region "A" of FIG. 1.

In FIG. 2, the driving TFT "T2" includes n-type amorphous silicon as the active layer. The source electrode "S2" of the driving TFT "T2," which is a source of the major carrier, i.e., electrons, is connected to the anode electrode of the luminescent diode "EL" and the drain electrode "D2" of the driving TFT "T2" is connected to the power line 9. The cathode electrode of the luminescent diode "EL" is grounded. The storage capacitor "C" is connected to the gate electrode "G2" of the driving TFT "T2" and the grounded cathode electrode of the luminescent diode "EL."

In the driving TFT "T2," a current between the drain electrode "D2" and the source electrode "S2" is given by $$I = \mu_n C_i (W/L)[(V_{GS}-V_{TH})V_{DS}-(V_{DS}^2/2)],$$

where $\mu_n$ is a field effect mobility of the driving TFT "T2," $C_i$ is a gate capacitance of the driving TFT "T2," W is a width of a channel of the driving TFT "T2," L is a length of the channel, $V_{GS}$ is a voltage between the gate electrode "G2" and the source electrode "S2," $V_{TH}$ is a threshold voltage, and $V_{DS}$ is a voltage between the drain electrode "D2" and the source electrode "S2."

The driving TFT "T2" is used in a saturation region, where the current "I" is constant to the increasing voltage "$V_{DS}$," so as to supply a regular current to the electroluminescent diode "EL." In the saturation region, the voltage $V_{DS}$ should be larger than a difference between the voltage $V_{GS}$ and the threshold voltage $V_{TH}$, i.e., $V_{DS} > V_{GS} - V_{TH}$.

By the way, electrical resistance of the electroluminescent diode "EL" increases as time goes by, and a voltage "$V_{EL}$" of the electroluminescent diode "EL" changes. Then, since a voltage at the source electrode "S2" changes, the voltages "$V_{GS}$" and "$V_{DS}$" vary, too. Here, the voltage "$V_{GS}$" and the voltage "$V_{DS}$" decrease. Therefore, the voltages "$V_{GS}$" and "$V_{DS}$" should be changed in order to provide the electroluminescent diode "EL" with an equal amount of current before.

Moreover, because the anode electrode of the electroluminescent diode "EL" is connected to the source electrode "S2" of the driving TFT "T2," which is the source of electron as stated above, more voltage should be applied to the gate electrode "G2" through the data line 14 of FIG. 1. Accordingly, new driving integrated circuit, which is electrically connected to the data line 14, is required.

SUMMARY OF THE INVENTION

Accordingly, the present invention is directed to an organic electroluminescence device and a manufacturing method of the same that substantially obviates one or more of problems due to limitations and disadvantages of the related art.

An advantage of the present invention is to provide an active matrix organic electroluminescence device that displays uniform images and is reliable.

Another advantage of the present invention a manufacturing method of an organic electroluminescence device that reduces processes and lowers cost.

Additional features and advantages of the invention will be set forth in the description, which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an active matrix organic electroluminescence device includes a substrate, a gate line on the substrate, a data line crossing the gate line, a power line parallel with the gate line, a switching thin film transistor electrically connected to the gate line, and the data line, wherein the switching thin film transistor includes a first gate electrode, a first active layer, and first source and drain electrodes, a driving thin film transistor electrically connected to the first drain electrode, wherein the driving thin film transistor includes a second gate electrode, a second active layer, and second source and drain electrodes, and a luminescent diode connected to the driving thin film transistor and the power line.

In another aspect, a manufacturing method of an active matrix organic electroluminescence device includes forming a gate line on a substrate, forming a data line crossing the gate line, forming a switching thin film transistor electrically connected to the gate line and the data line, wherein the switching thin film transistor includes a first gate electrode, a first active layer, and first source and drain electrodes, forming a driving thin film transistor electrically connected to the first drain electrode, wherein the driving thin film transistor includes a second gate electrode, a second active layer, and second source and drain electrodes, forming a luminescent diode connected to the second drain electrode, and forming a power line connected to the luminescent diode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENT

Reference will now be made in detail to an embodiment of the present invention, which is illustrated in the accompanying drawings.

Figure 1:
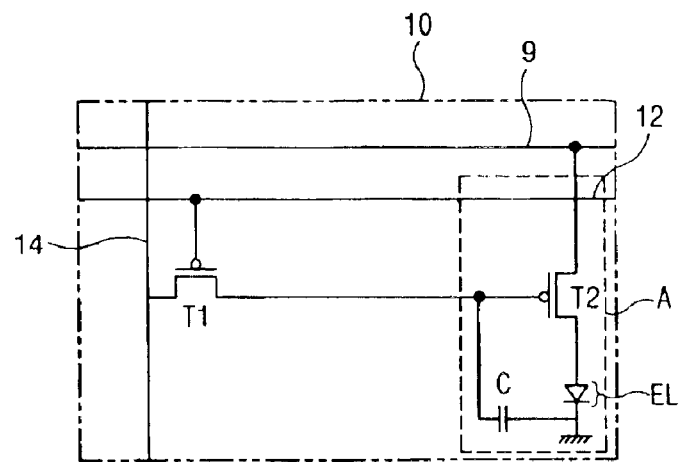
FIG. 1 is an equivalent circuit diagram for a pixel of an active matrix type organic electroluminescence device in the related art.
Figure 2:
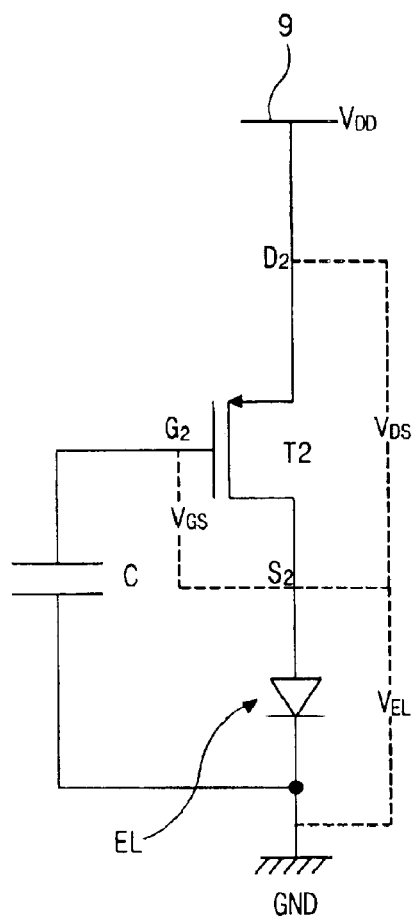
FIG. 2 is a circuit diagram of an active matrix type organic electroluminescence device having an n-type amorphous silicon TFT in the related art.
Figure 3:
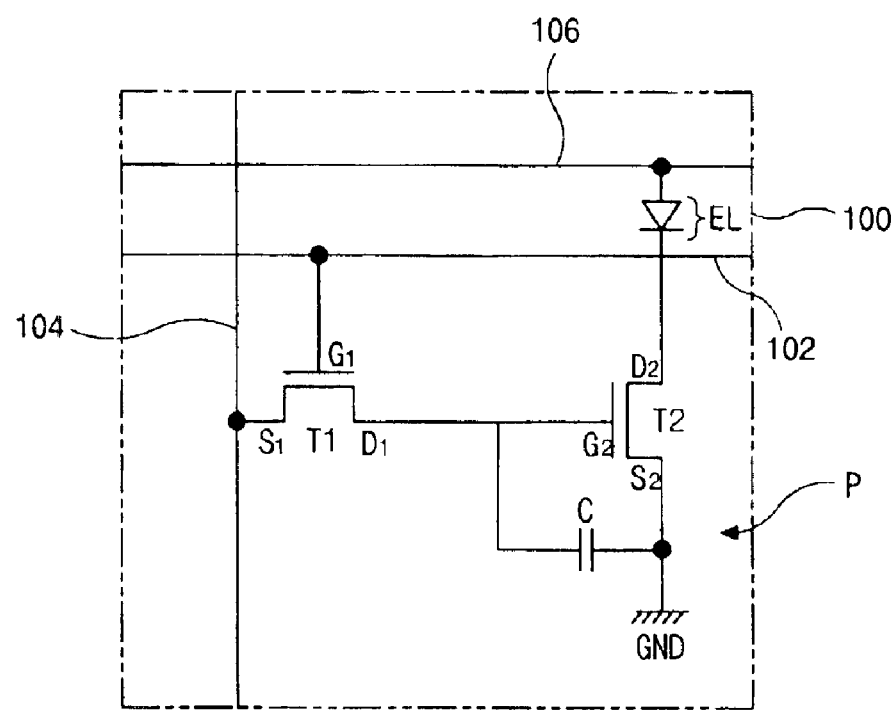
FIG. 3 is an equivalent circuit diagram of an active matrix type organic electro luminescence device according to an embodiment of the present invention.

FIG. 3 is an equivalent circuit diagram of an active matrix type organic electroluminescence device according to an embodiment of the present invention. In FIG. 3, a gate line 102 is formed horizontally in the context of the figure on a substrate 100. A power line 106 is formed parallel to the gate line 102. A data line 104 is formed vertically in the context of the figure and crosses the gate line 102 and the power line 106. A pixel "P" includes two thin film transistors (TFTs) "T1" and "T2," an electroluminescent diode "EL," and a storage capacitor "C." The TFTs are composed of a switching TFT "T1" and a driving TFT "T2." Each TFT includes a gate electrode, an active layer, and source and drain electrodes. The switching TFT "T1" is formed at the crossing of the gate and data lines 102 and 104. The gate electrode "G1" of the switching TFT "T1" is electrically connected to the gate line 102, and the source electrode "S1" of the switching TFT "T1" is electrically connected to the data line 104. The gate electrode "G2" of the driving TFT "T2" is electrically connected to the drain electrode "D1" of the switching TFT "T1." The source electrode "S2" of the driving TFT "T2," which is a source of electrons, which are the majority carrier, is grounded, and the drain electrode "D2" of the driving TFT "T2" is electrically connected to a cathode electrode of the electroluminescent diode "EL." An anode electrode of the electroluminescent diode "EL" is electrically connected to the power line 106. One end of the storage capacitor "C" is electrically connected to the gate electrode "G2" of the driving TFT "T2," and the other end of the storage capacitor "C" is also grounded.

In the present invention, the driving TFT "T2" includes n-type amorphous silicon as an active layer. Therefore, the driving TFT "T2" is n-type. The switching TFT "T1" may also include n-type amorphous silicon and can include p-type amorphous silicon.

When the driving TFT "T2" turns on by a signal through the switching TFT "T1" from the data line 104, electric current from the signal on the power line 106 passes through the electroluminescent diode "EL," and light is emitted from the electroluminescent diode "EL."

Here, the storage capacitor "C" compensates signal loss. That is, though the switching TFT "T1" turns off, the storage capacitor "C" maintains signal from the switching TFT "T1" until the next signal is transmitted.

In the present invention, since the driving TFT "T2" includes n-type amorphous silicon, uniform images can be displayed in a large area and the number of manufacturing processes and costs decrease.

Additionally, the anode electrode of the electroluminescent diode "EL" is connected to the drain electrode "D" of the driving TFT "T2," and the cathode electrode of the electroluminescent diode "EL" is connected to the power line 106. Therefore, although electrical resistance of the electroluminescent diode "EL" increases, the voltage "$V_{GS}$" between the gate electrode "G2" and the source electrode "S2" is not influenced. Thus a driving integrated circuit is not required to apply higher voltage to the gate electrode "G2."

Figure 4A:
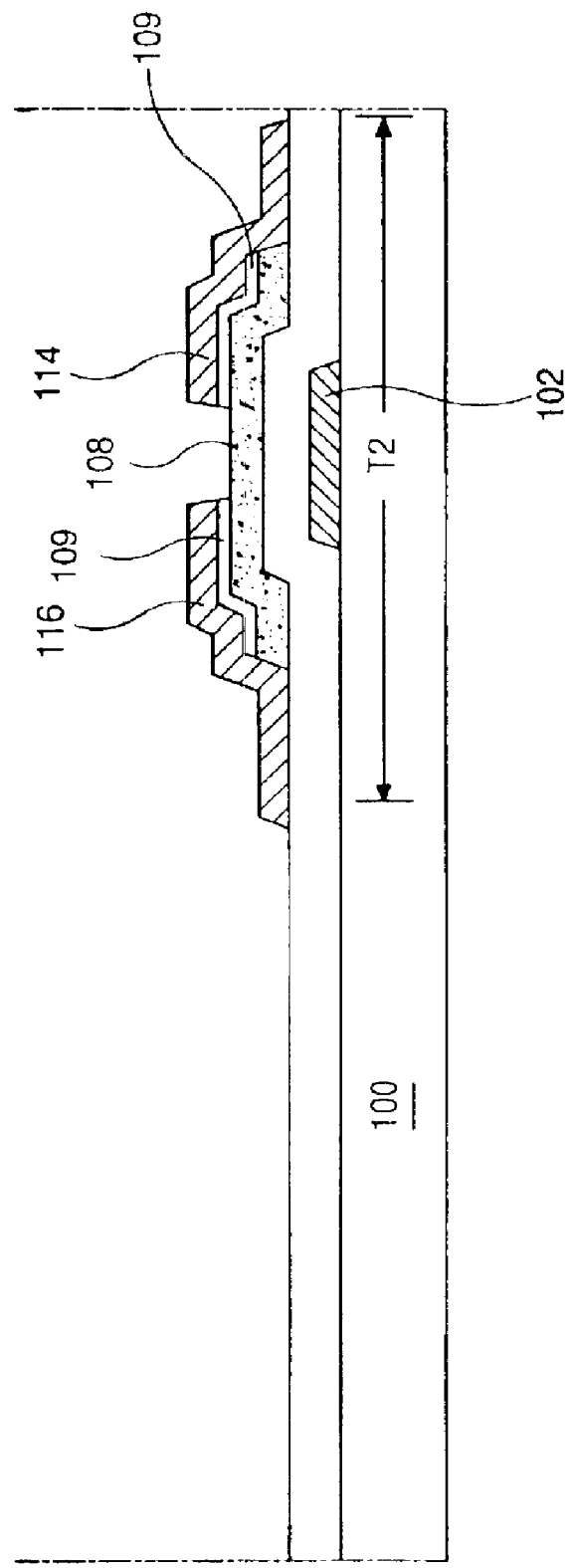
FIGS. 4A to 4C are cross-sectional views illustrating a manufacturing process of an organic electroluminescence device according to the embodiment of the present invention.
Figure 4B:
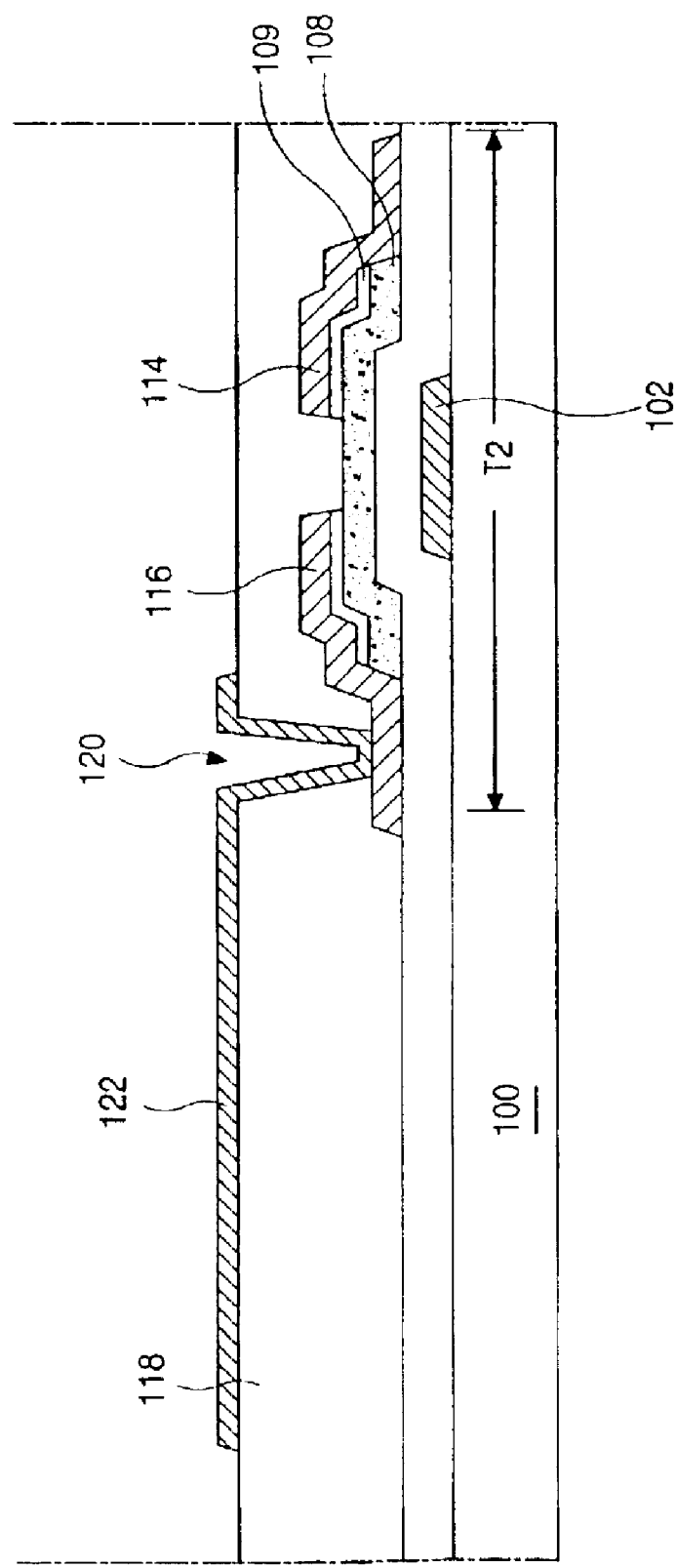
Figure 4C:
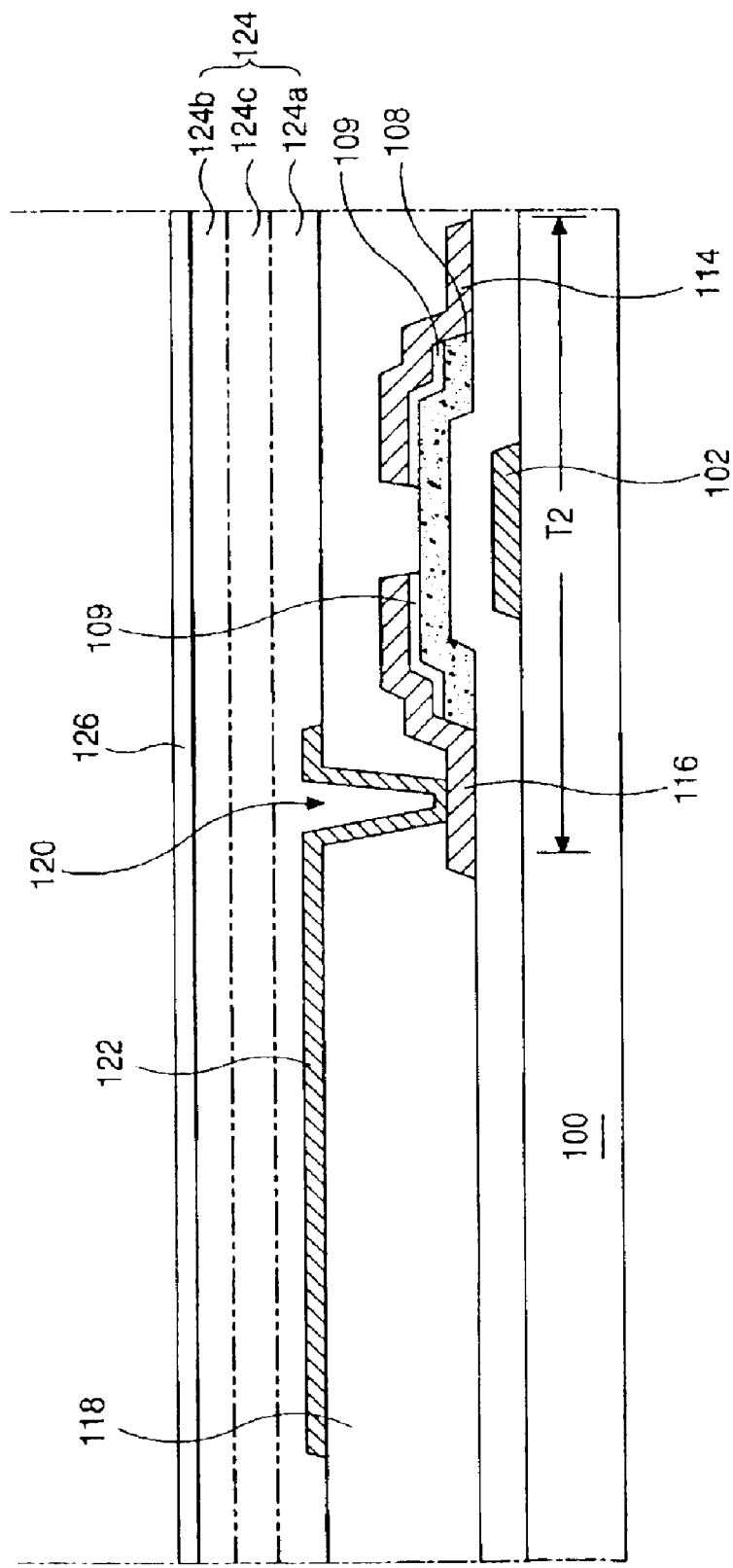

FIGS. 4A to 4C are cross-sectional views illustrating a manufacturing process of an organic electroluminescence device according to the embodiment of the present invention, and show the driving TFT and the electroluminescent diode.

In FIG. 4A, a gate electrode 102 is formed on a substrate 100 by depositing and pattering a conductive material and a gate insulator 103 is formed on the gate electrode 102. An active layer 108, which is made of n-type amorphous silicon, is formed on the gate insulator 103 and is positioned over the gate electrode 102. An ohmic contact layer 109 is formed on the active layer 108. The ohmic contact layer 109 is made of doped amorphous silicon. Source and drain electrodes 114 and 116 are formed on the ohmic contact layer 109 and spaced apart from each other. The gate electrode 102, active layer 108, and source and drain electrodes 114 and 116 form the driving TFT "T2." Although not shown in the figure, the switching TFT "T1"of FIG. 3, which has the same structure as the driving TFT "T2," is formed on the substrate 100.

The substrate 100 may be a transparent plastic substrate or a glass substrate. The gate electrode 102 includes one of aluminum (Al), an alloy of aluminum and neodymium (Nd), molybdenum (Mo), tungsten (W), and chromium (Cr). The source and drain electrodes 114 and 116 may be made of the same material as the gate electrode 102.

In FIG. 4B, a passivation layer 118 is formed by a coating method. The passivation layer 118 is patterned to form a contact hole 120 through the passivation layer 118, exposing the drain electrode 116. Next, a cathode electrode 122 is formed on the passivation layer 118 by depositing and patterning a conductive material. The cathode electrode 122 is connected to the drain electrode 116 through the contact hole 120.

The passivation layer 118 is made of benzocyclobutene (BCB) or acrylic resin. The conductive material of the cathode electrode 122 has low work function and may be one of aluminum, calcium (Ca), and magnesium (Mg).

In FIG. 4C, an organic layer 124 is formed on the cathode electrode 122 and an anode electrode 126 is formed on the organic layer 124. The organic layer 124 includes an electron transporting layer (ETL) 124a contacting the cathode electrode 122, an emissive layer 124c on the electron transporting layer 124a, and a hole transporting layer (HTL) 124b disposed on the emissive layer 124c and contacting the anode electrode 126.

The anode electrode 126 has high work function and is transparent. The anode electrode 126 may be made of indium-tin-oxide (ITO).

The organic layer 124 has high quantum efficiency and lowers driving voltage because carriers are not directly injected into the emissive layer 124c, but through the transporting layers 124a and 124b. Electrons and holes injected into the emissive layer 124c move toward the anode and cathode electrodes, respectively. However, the electrons and holes are intercepted by the transporting layers 124a and 124b and remain in the emissive layer 124c. Therefore, a luminous efficiency increases due to recombination of the remaining electrons and holes.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. An active matrix organic electroluminescence device, comprising:
   a substrate;
   a gate line on the substrate;
   a data line crossing the gate line;
   a power line parallel with the gate line;
   a power line on the substrate;
   a switching thin film transistor electrically connected to the gate line and the data line, the switching thin film transistor including a first gate electrode, a first active layer, and first source and drain electrodes;
   a driving thin film transistor electrically connected to the first drain electrode, the driving thin film transistor including a second gate electrode, a second active layer, and second source and drain electrodes; and
   a luminescent diode connected to the driving thin film transistor and the power line
   wherein the luminescent diode includes a first electrode connected to the second drain electrode of the driving thin film transistor; a second electrode connected to the power line; and an emissive layer disposed between the first and second electrodes, and
   wherein work function of the first electrode is smaller than work function of the second electrode.

2. The device according to claim 1, wherein the second active layer includes n-type amorphous silicon.

3. An active matrix organic electroluminescence device, comprising:
   a substrate;
   a gate line on the substrate;
   a data line crossing the gate line;
   a power line parallel with the gate line;
   a power line on the substrate;

a switching thin film transistor electrically connected to the gate line and the data line, the switching thin film transistor including a first gate electrode, a first active layer, and first source and drain electrodes;

a driving thin film transistor electrically connected to the first drain electrode, the driving thin film transistor including a second gate electrode, a second active layer, and second source and drain electrodes; and a luminescent diode connected to the driving thin film transistor and the power line, wherein the luminescent diode further includes an electron transporting layer and a hole transporting layer, the electron transporting layer disposed between the first electrode and the emissive layer, the hole transporting layer disposed between the second electrode and the emissive layer.

4. The device according to claim 3, wherein the electron transporting layer and hole transporting layer are organic.

5. The device according to claim 1, wherein the second electrode is transparent.

6. The device according to claim 1, wherein the first electrode includes one of calcium, aluminum, and magnesium.

7. The device according to claim 1, wherein the second electrode includes indium-tin-oxide.

8. The device according to claim 1, further comprising a storage capacitor connected to the second gate electrode and the second source electrode of the driving thin film transistor.

9. An active matrix organic electroluminescence device, comprising:

a substrate;

a gate line on the substrate;

a data line crossing the gate line;

a power line on the substrate;

a switching thin film transistor electrically connected to the gate line and the data line, the switching thin film transistor including a first gate electrode, a first active layer, and first source and drain electrodes;

a driving thin film transistor electrically connected to the first drain electrode, the driving thin film transistor including a second gate electrode, a second active layer, and second source and drain electrodes; and a luminescent diode connected to the driving thin film transistor and the power line, wherein the luminescent diode includes a first electrode connected to the second drain electrode of the driving thin film transistor, a second electrode connected to the power line and an emissive layer disposed between the first and second electrodes, and wherein work function of the first electrode is smaller than work function of the second electrode.

* * * * *